(12) United States Patent
Sasaki

(10) Patent No.: US 9,729,139 B2
(45) Date of Patent: Aug. 8, 2017

(54) COOPERATIVE CONTROL METHOD FOR POWER SEMICONDUCTOR ELEMENTS CONNECTED IN PARALLEL, CURRENT BALANCE CONTROL DEVICE, AND POWER MODULE

(71) Applicant: FUJI ELECTRIC CO., LTD., Kawasaki-shi, Kanagawa (JP)

(72) Inventor: Masahiro Sasaki, Azumino (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/199,898

(22) Filed: Jun. 30, 2016

(65) Prior Publication Data

US 2017/0054439 A1    Feb. 23, 2017

(30) Foreign Application Priority Data

Aug. 18, 2015   (JP) .................................. 2015-160977

(51) Int. Cl.
| | |
|---|---|
| *H03K 3/00* | (2006.01) |
| *H03K 17/28* | (2006.01) |
| *H03K 17/12* | (2006.01) |
| *H03K 17/082* | (2006.01) |

(52) U.S. Cl.
CPC .......... *H03K 17/28* (2013.01); *H03K 17/127* (2013.01); *H03K 17/0828* (2013.01)

(58) Field of Classification Search
None
See application file for complete search history.

(56) References Cited

U.S. PATENT DOCUMENTS

| | | | | |
|---|---|---|---|---|
| 6,014,322 A | * | 1/2000 | Higashi | ................... H02J 1/102 363/65 |
| 8,854,848 B1 | * | 10/2014 | Chen | ................... H02M 3/1584 323/283 |
| 2015/0061394 A1 | * | 3/2015 | Lin | ......................... H02J 1/102 307/64 |

FOREIGN PATENT DOCUMENTS

JP    2014-230307 A    12/2014

OTHER PUBLICATIONS

Maxim Integrated Circuits, "Daisy-Chaining SPI Devices", Application Note 3947, May 17, 2007.

* cited by examiner

*Primary Examiner* — Cassandra Cox
(74) *Attorney, Agent, or Firm* — Rabin & Berdo, P.C.

(57) ABSTRACT

A cooperative control method for a plurality of power semiconductor elements connected in parallel. The cooperative control method includes (1) connecting, in a daisy chain configuration, a plurality of current balance control circuits each for driving a corresponding power semiconductor element, and (2) responsive to an input to cause the power semiconductor elements to simultaneously perform switching operations, comparing current information of each power semiconductor element with that of an adjacent power semiconductor element, and delaying, using the current balance control circuits, turn-on time or turn-off time of each power semiconductor element, upon determining that the turn-on time or the turn-off time is earlier than turn-on time or turn-off time obtained from the current information of the adjacent power semiconductor element.

5 Claims, 11 Drawing Sheets

COOPERATIVE CONTROL METHOD FOR POWER SEMICONDUCTOR ELEMENTS CONNECTED IN PARALLEL, CURRENT BALANCE CONTROL DEVICE, AND POWER MODULE

CROSS-REFERENCE TO RELATED APPLICATION

This application is based upon and claims the benefit of priority of the prior Japanese Patent Application No. 2015-160977, filed on Aug. 18, 2015, the entire contents of which are incorporated herein by reference.

BACKGROUND OF THE INVENTION

1. Field of the Invention

Embodiments discussed herein relate to a cooperative control method for mutually adjusting the current imbalance among the power semiconductor elements connected in parallel, and to current balance control devices, and a power module integrally including the power semiconductor elements and the current balance control devices.

2. Background of the Related Art

In power conversion devices, such as an inverter and an uninterruptible power source apparatus, power conversion is performed by switching and driving power semiconductor elements. In the power semiconductor element, the maximum value of the current which one power semiconductor element is capable of feeding is limited in terms of physical properties and technically, and therefore when a load current exceeding this limit is needed, a plurality of power semiconductor elements is connected in parallel to increase the current capacity.

FIG. 7 illustrates a switching circuit formed by connecting two power semiconductor elements in parallel, FIG. 8 illustrates the current changes when two power semiconductor elements perform switching, FIG. 9 illustrates an example of a timing detection circuit, and FIG. 10 is an explanatory view of the operation of the timing detection circuit.

Note that, FIG. 7 illustrates a case of an IGBT (Insulated Gate Bipolar Transistor) as the power semiconductor element. However, the power semiconductor element is not limited to this IGBT, but an MOSFET (Metal-Oxide-Semiconductor Field-Effect Transistor) is also commonly used. This switching circuit is constituted by connecting the collectors and the emitters of an IGBT 101 and an IGBT 102, and may constitute, for example, a high-side arm portion and low-side arm portion in a totem pole output circuit of a power conversion device.

The IGBTs 101 and 102 connected in parallel in this manner are turned on or turned off by a pulse-like gate voltage that is simultaneously applied to the gates thereof, respectively. At this time, when the current flowing into the collectors is designated as Ic, a current Ic1 flows into the IGBT 101 and a current Ic2 flows into the IGBT 102. Ideally, the current Ic is evenly distributed by the IGBTs 101 and 102 so as to satisfy Ic1=Ic2=Ic/2. However, in the transitional period of this switching operation, an imbalance may occur between the currents flowing into the IGBTs 101 and 102.

Such current imbalance is caused by a difference in the turn-on or turn-off time between the parallel elements due to the variations of the device characteristics (Vth, Vce_sat, and the like) and the like which the IGBTs 101 and 102 have, an asymmetry of the substrate layout, and the like. If a time difference occurs in the turn-on time when the current starts to flow and in the turn-off time when the current stops, between the IGBTs 101 and 102, a transitional current imbalance will occur between the IGBTs 101 and 102. For example, as illustrated in FIG. 8, assume that the IGBT 101 first started to flow and then a little later the IGBT 102 started to flow. In this case, at the turn-on time, the current flows only through the IGBT 101 and therefore in the period of a time delay difference Δtd, the current will concentrate on the IGBT 101 and a high current will flow therethrough. If current concentration occurs, then the current exceeding the maximum rating flows, though for a short time, so that the IGBT 101 might be destroyed or the element temperature might abruptly rise to significantly degrade the element characteristics.

Therefore, it is proposed that the current imbalance among a plurality of IGBTs provided in parallel is reduced (e.g., see Japanese Laid-open Patent Publication No. 2014-230307). In this Japanese Laid-open Patent Publication No. 2014-230307, the turn-on and turn-off times of each IGBT are detected, and the turn-on and turn-off times of an IGBT which is turned on earlier are controlled so that the time delay difference Δtd becomes zero, i.e., so that these times are delayed. For the purpose of this control, a variable gate resistor circuit is provided in a circuit which drives the gate of the IGBT and the resistance value of the variable gate resistor circuit is varied according to the time delay difference Δtd. Thus, a plurality of IGBTs which is connected in parallel and is simultaneously driven is capable of reducing the current imbalance among the IGBTs.

The turn-on and turn-off times of the IGBT may be detected by a timing detection circuit illustrated in FIG. 9. The timing detection circuit of FIG. 9 detects the turn-on and turn-off times of the IGBT 101, for example, but also in the other IGBT 102, the turn-on and turn-off times are detected, respectively, by a timing detection circuit having the same configuration.

This timing detection circuit includes a sense resistor Rs, a comparator 103, and a reference voltage source Vref. The IGBT 101 has a current sensing terminal that is formed by partially separating and partitioning the emitter region of the chip of the IGBT 101. A current corresponding to the area ratio between the current sensing terminal and the main emitter terminal will flow into this current sensing terminal as a sense current Is. This sense current Is flows to the ground through the sense resistor Rs connected to the current sensing terminal of the IGBT 101, so that a sensing voltage Vs proportional to the emitter current is generated between the both ends of the sense resistor Rs. This sensing voltage Vs is compared with a reference voltage source Vref by the comparator 103 and a signal Ipulse is output.

This signal Ipulse rises when the sensing voltage Vs exceeds the reference voltage source Vref and falls when the sensing voltage Vs falls below the reference voltage source Vref as illustrated in FIG. 10. The rising of this signal Ipulse provides the turn-on time of the IGBT 101, and the falling of the signal Ipulse provides the turn-off time of the IGBT 101. These times are sent to a non-illustrated control circuit, where it is compared with the times of the IGBT 102, and the resistance value of the variable gate resistor circuit is controlled so that the respective times match with each other. Thus, the turn-on and turn-off times of the IGBTs 101 and 102 connected in parallel will be aligned to reduce the current imbalance between the IGBTs 101 and 102.

As described above, when the number of power semiconductor elements connected in parallel is two, in the control circuit of each of the power semiconductor elements, the turn-on and turn-off times just need to be compared with the turn-on and turn-off times of the power semiconductor element of the connection party. However, if the number of power semiconductor elements connected in parallel is increased, cooperative control for mutually communicating information about the turn-on and turn-off times among all the power semiconductor elements is needed and therefore the sizes of the control circuits will increase, respectively.

Then, the examples of the method for reducing the current imbalance among a plurality of power semiconductor elements include a method for measuring the characteristics of the power semiconductor elements in advance and selecting and combining the power semiconductor elements having close characteristics from among these power semiconductor elements. This method takes a great amount of effort and time to select the power semiconductor elements having the uniform characteristics, and therefore is not the method suitable for power conversion devices to be mass-produced. Therefore, as the cooperative control method for reducing the current imbalance among a plurality of power semiconductor elements, a master-slave type cooperative control method is known.

FIG. 11 illustrates a master-slave type cooperative control method. Here, as one example, a case will be described where six power modules each including a power semiconductor element and its control circuit are connected in parallel.

The master-slave type is a form, in which one module among six power modules PM1 to PM6 connected in parallel is set as a master module and the other modules are set as slave modules to perform cooperative operation. The master module (here, the power module PM1) is connected to all the other slave modules (here, the power modules PM2 to PM6) to collect the timing information of turn-on and turn-off about all the slave modules. The master module calculates, from its own timing information and the collected timing information about the slave modules, the individual reference information for reducing a current imbalance, and transmits the calculated reference information to each corresponding slave module. The master module controls the current balance using the calculated reference information as a control target. The slave module controls the current balance using, as a reference, the reference information provided from the master module. Thus, a reduction of the current imbalance among all the power modules PM1 to PM6 is achieved.

In accordance with the master-slave type cooperative control, the master module detects the operation states of all the modules including the master module, and calculates, from the detected operation states, the reference information to be targeted by each module. Such calculation needs to be performed a number of times, the number being the same as the number of the power modules connected in parallel, and therefore becomes a heavy load on the master module, and additionally the configuration of the power modules becomes complicated.

Moreover, every time the number of parallel connections is increased, the master module needs a new communication line and new input/output terminals for a newly added slave module, and therefore there is a problem that the variation for each of the parallel connections needs to be prepared in advance.

SUMMARY OF THE INVENTION

According to one aspect of the embodiments, there is provided a cooperative control method for power semiconductor elements connected in parallel. The cooperative control method includes: connecting, in daisy chain configuration, current balance control circuits for respectively driving the power semiconductor elements connected in parallel; comparing current information about one of the power semiconductor elements with current information about an adjacent one of the power semiconductor elements adjacent to the one power semiconductor element every time all the power semiconductor elements are caused to simultaneously perform switching operation; and delaying, by one of the current balance control circuits corresponding to the one power semiconductor element, turn-on and turn-off times obtained from the current information about the one power semiconductor element, when the turn-on and turn-off times obtained from the current information about the one power semiconductor element are earlier than turn-on and turn-off times obtained from the current information about the adjacent power semiconductor element.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 6A and 6B illustrate the operations of the current balance control circuit, wherein FIG. 6A is the time chart at the time of startup and FIG. 6B is the time chart at the time of settling;

DETAILED DESCRIPTION OF THE INVENTION

Hereinafter, embodiments disclosed herein will be described in detail with reference to the accompanying drawings. Note that, in the description below, a case will be described where a switching circuit is constituted from six power modules as an example, but the embodiments discussed herein are applicable to the cases where the switching circuit is constituted from two or more power modules. Moreover, a power semiconductor element will be illustrated, with an IGBT as an example, but a power MOSFET is also applicable.

Figure 1:
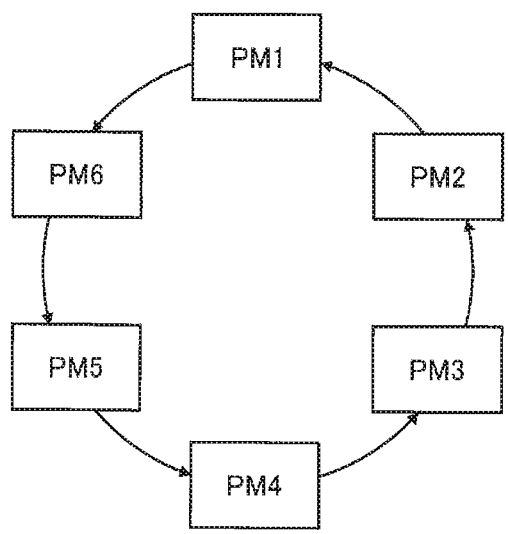
FIG. 1 illustrates a schematic configuration in which cooperative control of power semiconductor elements connected in parallel is realized using daisy chain configuration.
Figure 2:
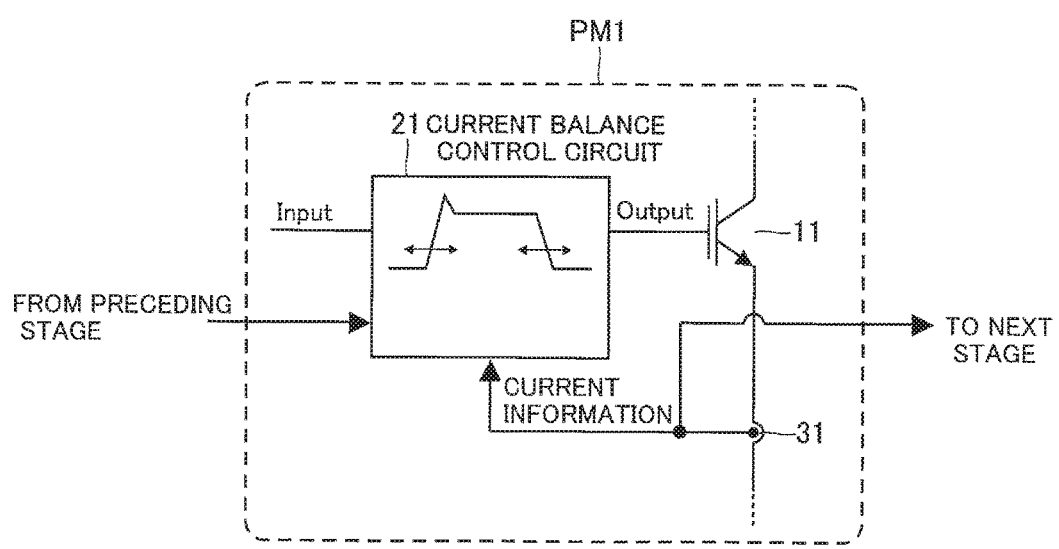
FIG. 2 illustrates a configuration example of a power module.
Figure 3:
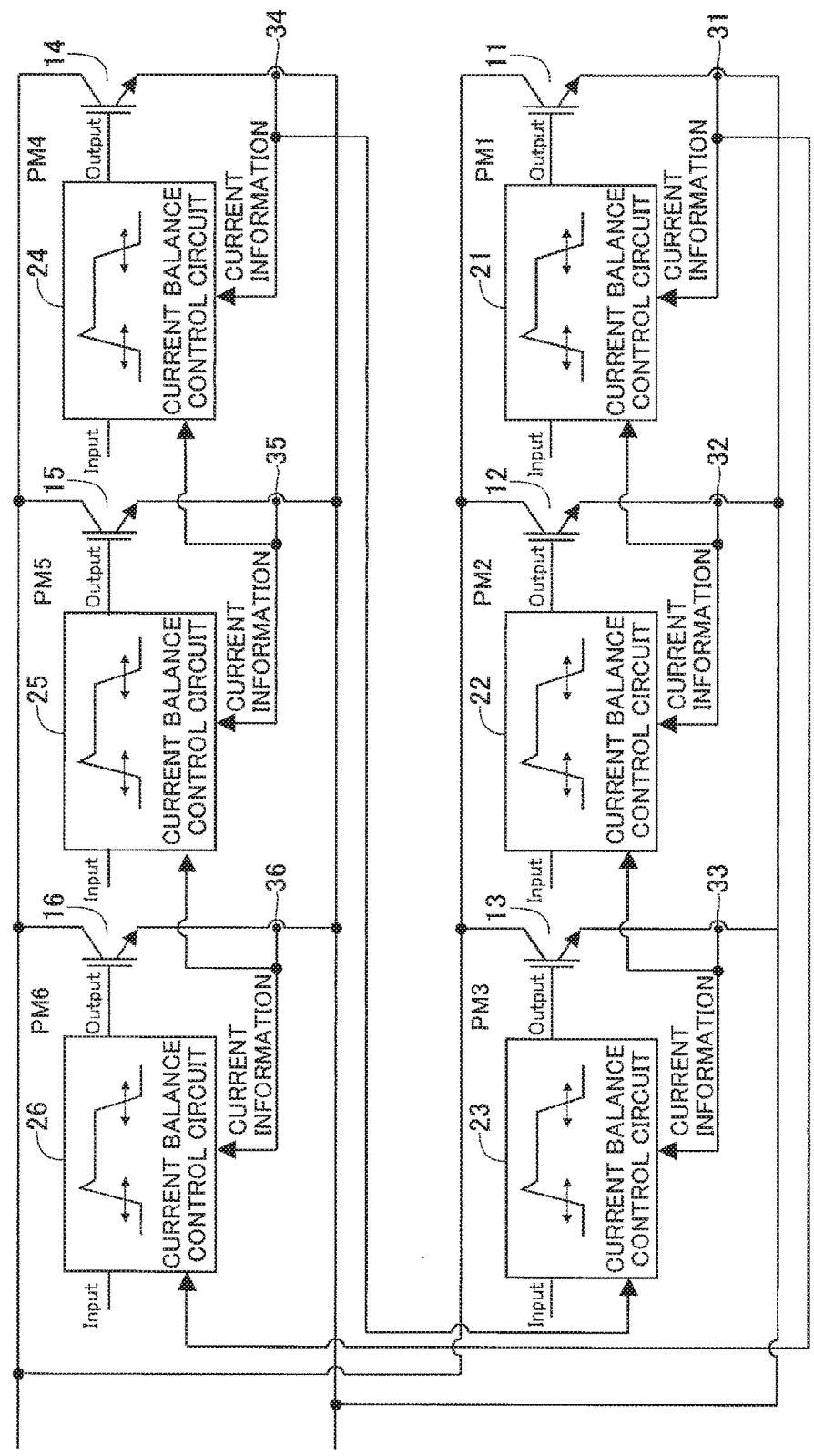
FIG. 3 is the overall view of a switching circuit constituted from six power modules.
Figure 4:
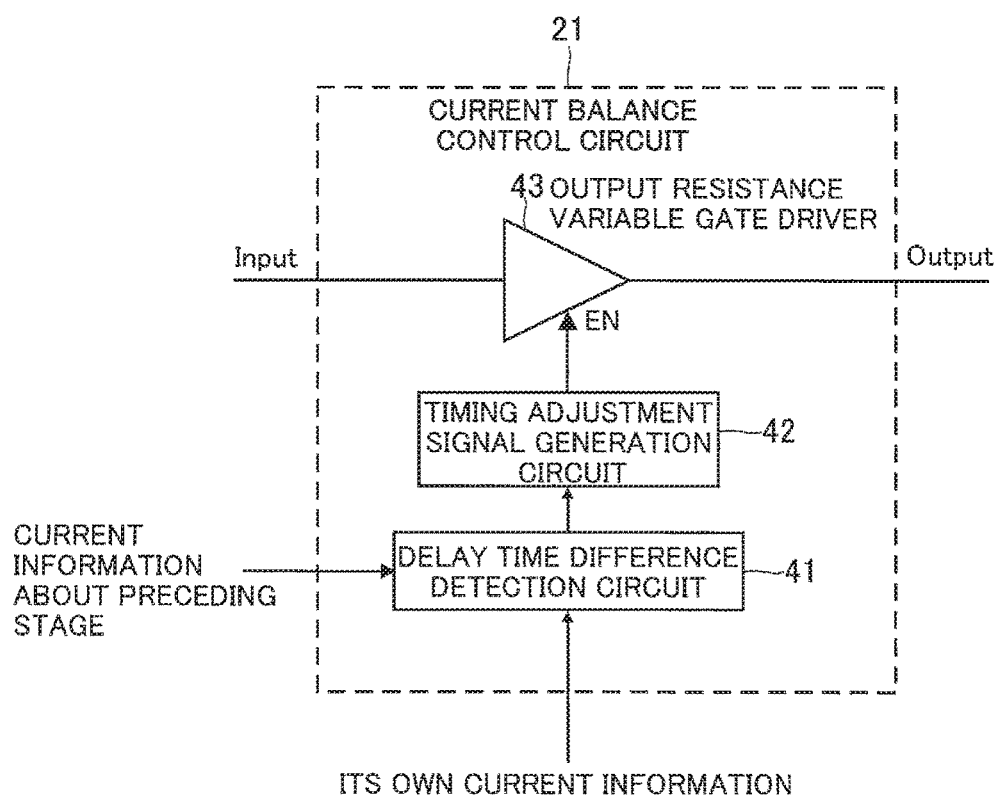
FIG. 4 illustrates a configuration example of a current balance control circuit.
Figure 5:
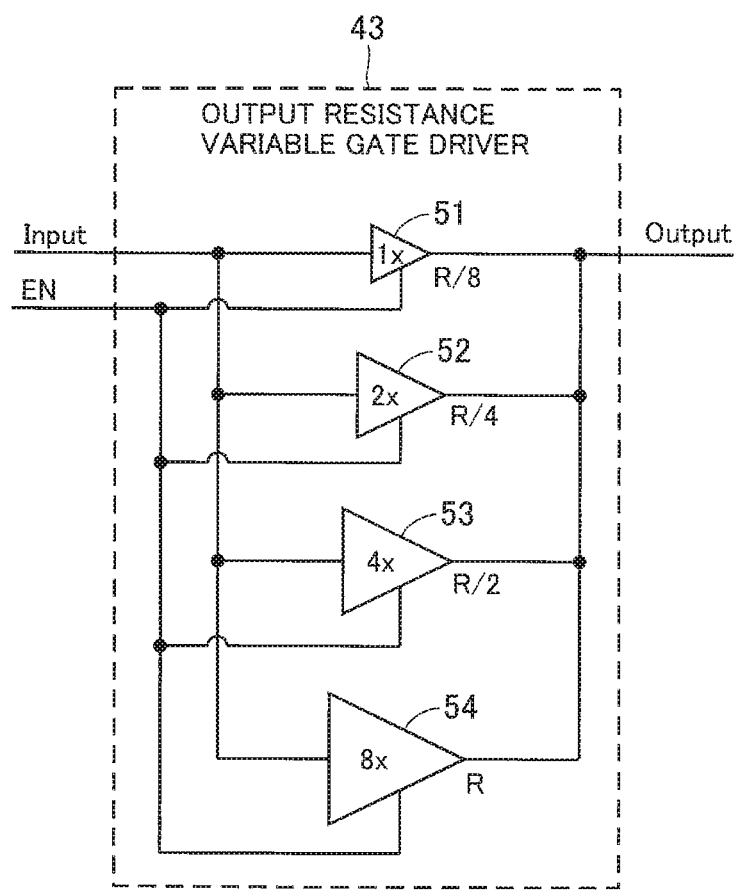
FIG. 5 illustrates a configuration example of an output resistance variable gate driver.
Figure 6A:
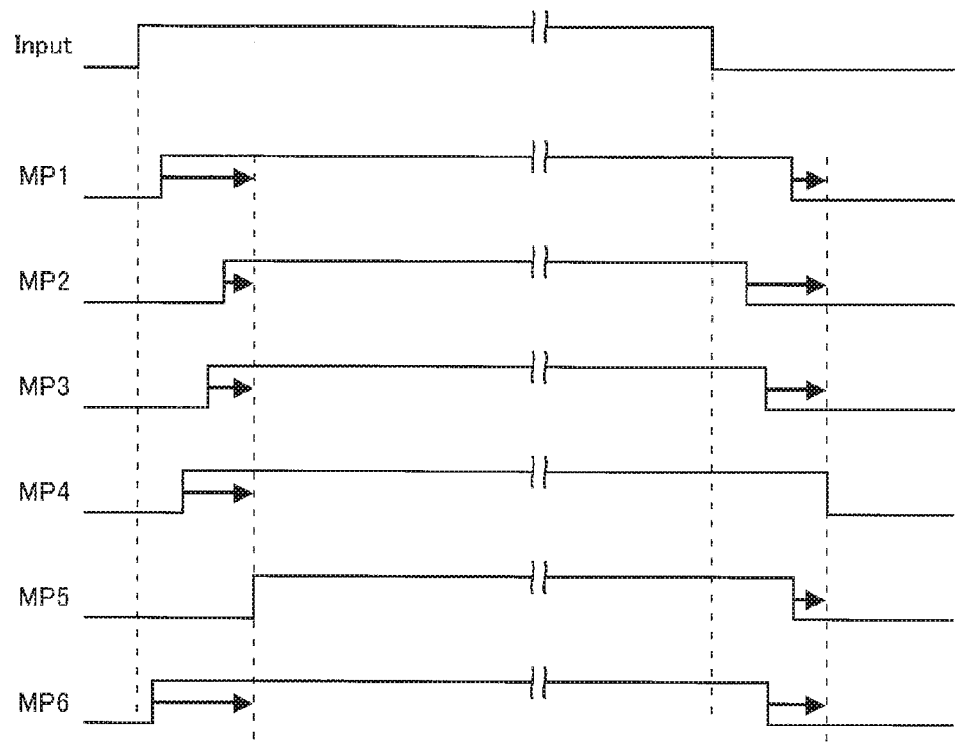
Figure 6B:
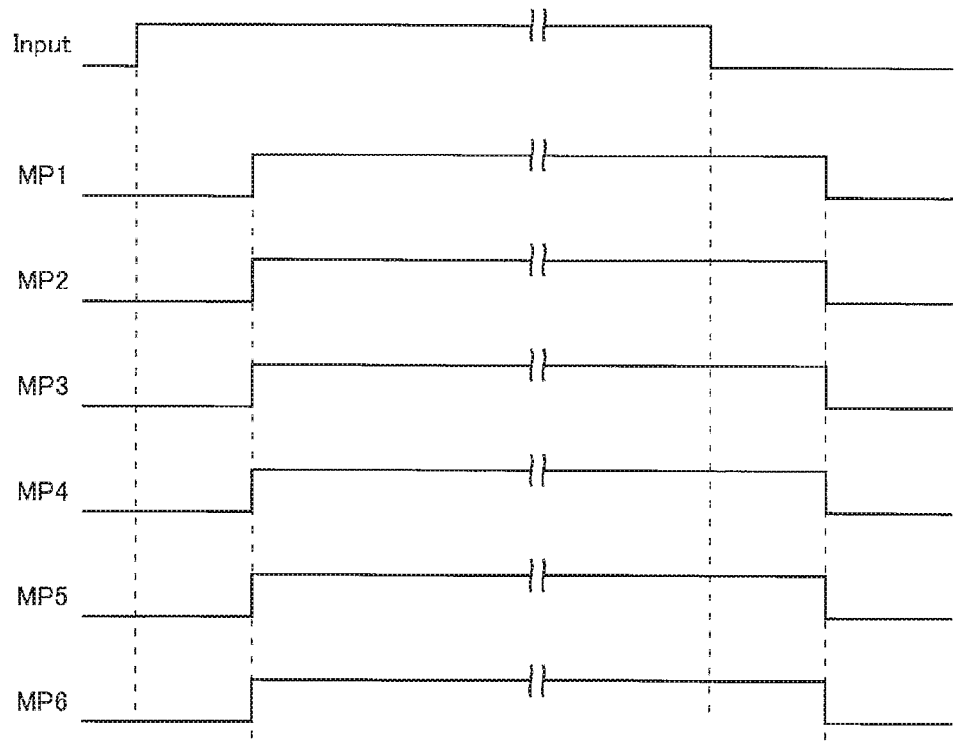
Figure 7:
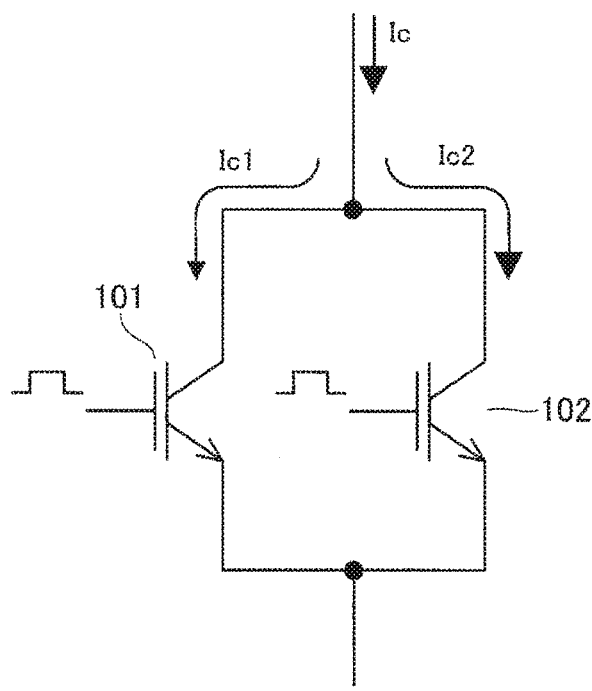
FIG. 7 illustrates a switching circuit formed by connecting two power semiconductor elements in parallel.
Figure 8:
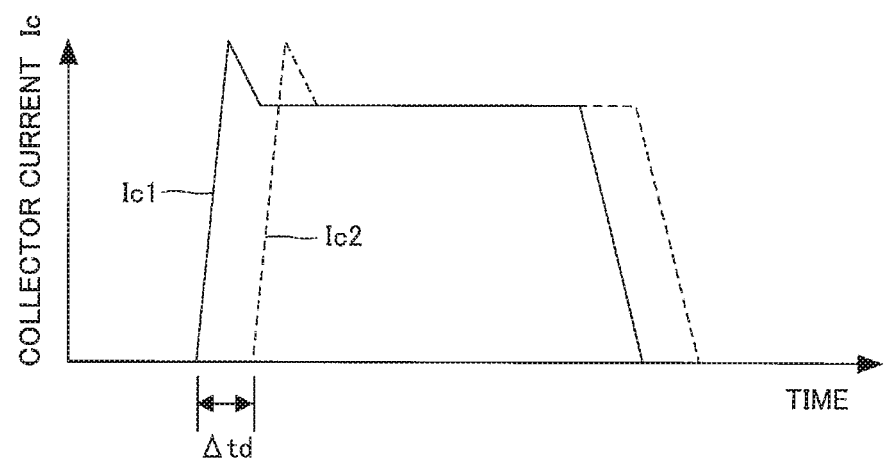
FIG. 8 illustrates the current changes when the two power semiconductor elements perform switching.

FIG. 1 illustrates a schematic configuration in which cooperative control of the power semiconductor elements connected in parallel is realized in daisy chain configuration, FIG. 2 illustrates a configuration example of a power module, and FIG. 3 is the overall view of a switching circuit constituted from six power modules. FIG. 4 illustrates a configuration example of a current balance control circuit, FIG. 5 illustrates a configuration example of an output resistance variable gate driver, and FIGS. 6A and 6B illustrate the operations of the current balance control circuit, wherein FIG. 6A is the time chart at the time of startup and FIG. 6B is the time chart at the time of settling.

The switching circuit is constituted from six power modules PM1 to PM6 as illustrated in FIG. 3, in which all IGBTs 11 to 16 are connected in parallel. Moreover, current balance control circuits 21 to 26 are connected in daisy chain configuration as illustrated in FIG. 1. That is, in the IGBTs 11 to 16 of the power modules PM1 to PM6, the collectors thereof and emitters thereof are connected together, respectively, and the gates thereof are driven by the current balance control circuits 21 to 26, respectively.

The power modules PM1 to PM6 each have the same configuration, and therefore here a specific configuration thereof will be described using the power module PM1 representatively illustrated in FIG. 2. In the IGBT 11, a sense-current detection section 31 is connected to the emitter thereof. This sense-current detection section 31 may be a shunt resistor connected in series to the emitter of the IGBT 11, for example, and a signal converted to a voltage signal by this shunt resistor is detected as the current information. Moreover, the emitter region of the IGBT 11 is divided into a sense area and a main area, the current flowing through the sense area is converted to a voltage signal by the sense resistor and the converted signal is detected as the current information.

The current information detected by this sense-current detection section 31 is supplied to its own current balance control circuit 21 and is also supplied to the current balance control circuit 26 of the power module PM6 of the next stage. Moreover, the current balance control circuit 21 receives the current information which is detected by the sense-current detection section 32 of the power module PM2 of the preceding stage. In this manner, the current balance control circuit 21 controls based on its own current information and the current information about the power module PM 2 of the preceding stage so that a time delay difference Δtd of each of the turn-on and turn-off times of the IGBT 11 between the PM1 and the PM2 becomes zero. Similarly, the current balance control circuit 22 controls based on its own current information and the current information obtained from the sense-current detection section 33 of the power module PM3 of the preceding stage so that the time delay difference Δtd of each of the turn-on and turn-off times of the IGBT 12 between the PM2 and the PM3 becomes zero. The current balance control circuit 23 controls based on its own current information and the current information obtained from the sense-current detection section 34 of the power module PM4 of the preceding stage so that the time delay difference Δtd of each of the turn-on and turn-off times of the IGBT 13 between the PM3 and the PM4 becomes zero. The current balance control circuit 24 controls based on its own current information and the current information obtained from the sense-current detection section 35 of the power module PM5 of the preceding stage so that the time delay difference Δtd of each of the turn-on and turn-off times of the IGBT 14 between the PM4 and the PM5 becomes zero. The current balance control circuit 25 controls based on its own current information and the current information obtained from the sense-current detection section 36 of the power module PM6 of the preceding stage so that the time delay difference Δtd of each of the turn-on and turn-off times of the IGBT 15 between the PM5 and the PM6 becomes zero. Then, the current balance control circuit 26 controls based on its own current information and the current information obtained from the sense-current detection section 31 of the power module PM1 of the preceding stage so that the time delay difference Δtd of each of the turn-on and turn-off times of the IGBT 16 between the PM6 and the PM1 becomes zero.

The current balance control circuits 21 to 26 each have the same configuration, and therefore here a specific configuration thereof will be described using the current balance control circuit 21 representatively illustrated in FIG. 4. The current balance control circuit 21 includes a delay time difference detection circuit 41, a timing adjustment signal generation circuit 42, and an output resistance variable gate driver 43.

Figure 9:
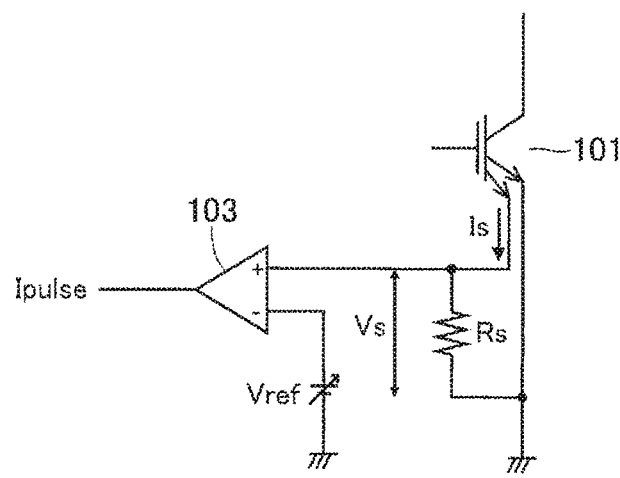
FIG. 9 illustrates an example of a timing detection circuit.
Figure 10:
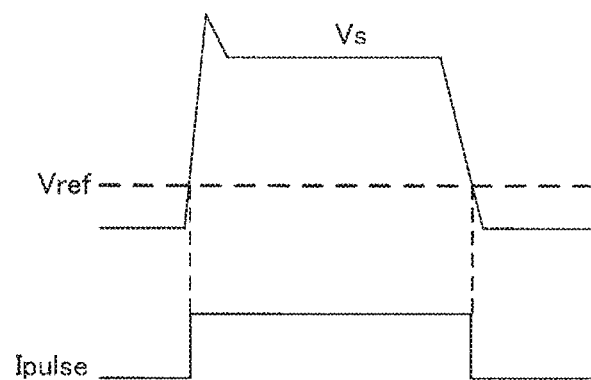
FIG. 10 is an explanatory view of the operation of the timing detection circuit.
Figure 11:
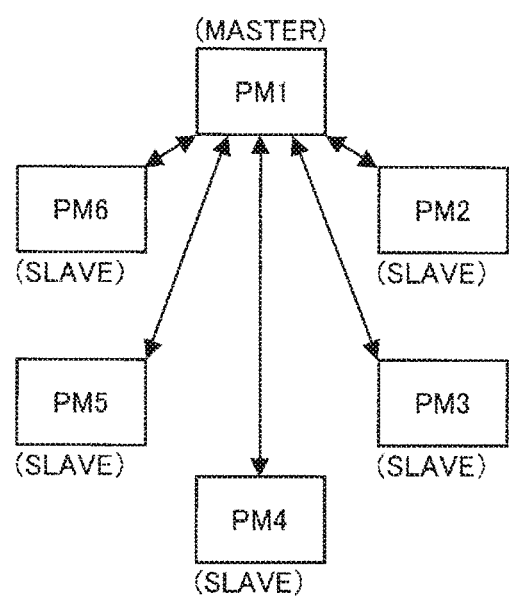
FIG. 11 illustrates a master-slave type cooperative control method.

The delay time difference detection circuit 41 receives the current information from its own sense-current detection section 31 and the current information detected by the power module PM2 of the preceding stage. The delay time difference detection circuit 41 first detects the turn-on and turn-off times of the IGBT 11 and IGBT 12 from the respectively input current information. These times are detected by the timing detection circuit illustrated in FIG. 9, for example. Next, the delay time difference detection circuit 41 compares the respectively detected turn-on and turn-off times of the IGBT 11 and IGBT 12 to calculate a delay time difference of each of the turn-on and turn-off times between the IGBT 11 and IGBT 12. That is, with regard to the turn-on time, if its own turn-on time is designated as time t1 and the turn-on time of the preceding stage is designated as time t2, the delay time difference detection circuit 41 determines whether t1−t2>0 is satisfied, and detects a delay time difference if it is satisfied. If the time difference t1−t2 is not greater than 0, a time difference 0 is detected. As described above, the delay time difference detection circuit 41 outputs a delay time difference when its own turn-on time is earlier than the turn-on time of the preceding stage, while outputs the delay time difference=0 when its own turn-on time is later than the turn-on time of the preceding stage. Moreover, with regard to the turn-off, similarly the times are compared and a delay time difference corresponding to the time difference between the times is detected.

The timing adjustment signal generation circuit 42 generates, upon receipt of a delay time difference in turn-on and a delay time difference in turn-off from the delay time difference detection circuit 41, a timing adjustment signal corresponding to the delay time difference. This timing adjustment signal is converted to a digital signal by a decoder provided in the output stage of the timing adjustment signal generation circuit 42, and the resulting digital signal is input to an enable terminal EN of the output resistance variable gate driver 43.

The output resistance variable gate driver 43 may have a configuration illustrated in FIG. 5, for example. That is, in this output resistance variable gate driver 43, a plurality of (four, in the illustrated example) signal output circuits 51 to 54 which is segmented each having a predetermined output resistance value is provided in parallel as the output stage of the output resistance variable gate driver 43.

The output signal of the decoder that is input to the enable terminal EN is used as an enable signal which selectively permits the operation of the signal output circuits 51 to 54. The enable signal selectively drives the signal output circuits 51 to 54 in accordance with a gate resistance to be set, thereby variably setting the output resistance (gate resistance) thereof. Note that, as this output resistance variable gate driver 43, an example is illustrated in which a plurality of signal output circuits 51 to 54, for example, each having a binary-weighted output resistance value is provided in parallel.

Next, the operation of the embodiment discussed herein will be described using the time charts illustrated in FIGS. 6A and 6B. First, the current balance control circuits 21 to 26 simultaneously receive an input signal Input and then output output signals Output for driving the gates of the IGBTs 11 to 16, respectively. At this time, in the power module PM1, the current balance control circuit 21 compares its own turn-on time with a turn-on time of the power module PM2 of the preceding stage. In the example of FIG. 6A, because the turn-on time of the power module PM1 is earlier than the turn-on time of the power module of the preceding stage, the current balance control circuit 21 outputs, as the enable signal, a decoded signal corresponding to the delay time difference to the output resistance variable gate driver 43. Similarly, a turn-off time is also compared with a time of the preceding stage, and a decoded signal corresponding to the delay time difference is output. In this illustrated example, because a turn-off time of the power module PM1 is later than a turn-off time of the preceding stage, the current balance control circuit 21 outputs a decoded signal corresponding to the delay time difference=0 to the output resistance variable gate driver 43.

With regard to each of the other power modules PM2 to PM6 also, similarly, its own turn-on and turn-off times are compared with the turn-on and turn-off times of the preceding stage, and if its own time is earlier, a delay time difference from the time of the preceding stage is calculated.

Each delay time difference calculated in this manner is reflected on the output resistance variable gate driver 43 when the power modules PM1 to PM6 each perform next switching operation, and the output resistance of the output resistance variable gate driver 43 is varied to an output resistance corresponding to each delay time difference. Also in this switching operation, in each of the power modules PM1 to PM6, its own turn-on and turn-off times are compared with the turn-on and turn-off times of the preceding stage, and if its own time is earlier, a delay time difference from the time of the preceding stage is calculated. This delay time difference is reflected on the output resistance variable gate driver 43 when the power modules PM1 to PM6 each perform next switching operation, and the output resistance of the output resistance variable gate driver 43 is varied to an output resistance corresponding to each delay time difference.

The power modules PM1 to PM6 each repeat the switching operation several times in this manner, so that the delay time differences among all the power modules PM1 to PM6 will be eliminated. Eventually, as illustrated in FIG. 6B, the turn-on and turn-off times of all the power modules PM1 to PM6 will be aligned with the latest turn-on and turn-off times in the switching operation at the time of startup. That is, all the power modules PM1 to PM6 each will perform switching operation in a state where the turn-on and turn-off times are kept aligned.

As described above, the preferred embodiments of the present invention have been described, but the present invention is not limited to the above-described embodiments. For example, for the output resistance variable gate driver 43, an example has been illustrated in which a plurality of signal output circuits 51 to 54 each having a binary-weighted output resistance value is provided in parallel, but a plurality of signal output circuits each having the same resistance value may be provided in parallel. Moreover, instead of the output resistance variable gate driver 43, a variable gate resistor circuit may be provided between the gate driver and the IGBT and the gate resistance of this variable gate resistor circuit may be varied by the enable signal.

The above-described cooperative control method for power semiconductor elements connected in parallel, current balance control device and power module allow the current balance control circuit of one type to be connected in daisy chain configuration, and therefore have an advantage of not being restricted by the number of parallel connections.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A cooperative control method for a plurality of power semiconductor elements connected in parallel, the cooperative control method comprising:
   connecting, in a daisy chain configuration, a plurality of current balance control circuits for respectively driving the plurality of power semiconductor elements connected in parallel; and
   responsive to an input to cause the plurality of power semiconductor elements to simultaneously perform switching operations,
   comparing current information of each of the power semiconductor elements with current information of another of the power semiconductor elements that is adjacent to said each power semiconductor element, and
   delaying, by one of the current balance control circuits corresponding to said each power semiconductor element, turn-on time or turn-off time obtained from the current information of said each power semiconductor element, upon determining that the turn-on time or the turn-off time is earlier than turn-on time or turn-off time obtained from the current information of the another power semiconductor element.

2. A current balance control device for driving one of a plurality of power semiconductor elements connected in parallel, the current balance control device comprising:
   a delay time difference detection circuit configured to
   receive current information of the one power semiconductor element and current information of another of the power semiconductor elements that is adjacent to the one power semiconductor element, and
   responsive to an input to cause the plurality of power semiconductor elements to simultaneously perform switching operations, and upon determining that turn-on time or turn-off time of the one power semiconductor element is earlier than turn-on time or turn-off time of the another power semiconductor element, detect a delay time difference between the turn-on times or the turn-off times of the one power semiconductor element and the another power semiconductor element;

a timing adjustment signal generation circuit configured to generate a timing adjustment signal for adjusting the turn-on time or turn-off time of the one power semiconductor element according to the delay time difference; and a gate driver configured to vary the turn-on time or the turn-off time of the one power semiconductor element so as to delay the turn-on time or the turn-off time of the one power semiconductor element in accordance with the timing adjustment signal.

3. The current balance control device according to claim 2, wherein:

each of the plurality of power semiconductor elements has a current balance control device configured similarly to the current balance control device of the one power semiconductor element, and has two of power semiconductor elements adjacent thereto; and the current balance control devices are connected in a daisy chain configuration so that for each power semiconductor element, the delay time difference detection circuit receives current information of one of the two adjacent power semiconductor elements corresponding thereto, and supplies the current information of said each power semiconductor element to a delay time difference detection circuit of the other of the two adjacent power semiconductor elements corresponding thereto.

4. The current balance control device according to claim 2, wherein the gate driver is configured to vary an output resistance in accordance with the timing adjustment signal.

5. A power module, comprising:

a plurality of power semiconductor elements connected in parallel, and a plurality of current balance control devices, each for driving a corresponding one of the power semiconductor elements, each current balance control device including a delay time difference detection circuit configured to receive current information of the corresponding power semiconductor element and current information of another of the power semiconductor elements adjacent to the corresponding power semiconductor element, and responsive to an input to cause the plurality of power semiconductor elements to simultaneously perform switching operations, and upon determining that turn-on time or turn-off time of the corresponding power semiconductor element is earlier than turn-on time or turn-off time of the another power semiconductor element, detect a delay time difference between the turn-on times or the turn-off times of the corresponding power semiconductor element and the another power semiconductor elements;

a timing adjustment signal generation circuit configured to generate a timing adjustment signal for adjusting the turn-on time or the turn-off time of the corresponding power semiconductor element so as to delay the turn-on time or the turn-off time of the corresponding power semiconductor element according to the delay time difference; and an output resistance variable gate driver configured to vary the turn-on time or the turn-off time of the corresponding power semiconductor element in accordance with the timing adjustment signal.

* * * * *